United States Patent

Iwasaki

[11] Patent Number: 6,141,210
[45] Date of Patent: *Oct. 31, 2000

[54] EXTERNAL STORAGE DEVICE

[75] Inventor: Hiroshi Iwasaki, Yokahama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/657,383

[22] Filed: Jun. 3, 1996

Related U.S. Application Data

[62] Division of application No. 08/205,451, Mar. 4, 1994, Pat. No. 5,550,709.

[30] Foreign Application Priority Data

Jul. 23, 1993 [JP] Japan ................................. 5-182650

[51] Int. Cl.$^7$ .................................................. H05K 7/10
[52] U.S. Cl. ........................ 361/684; 361/683; 361/685; 361/737; 439/160
[58] Field of Search .................... 361/684, 685, 361/683, 737, 733, 754; 235/492; 439/160; 428/76

[56] References Cited

U.S. PATENT DOCUMENTS

| | | |
|---|---|---|
| 4,264,917 | 4/1981 | Ugon . |
| 4,943,464 | 7/1990 | Gloton et al. . |
| 5,027,190 | 6/1991 | Haghiri-Tehrani et al. ............. 257/679 |
| 5,061,845 | 10/1991 | Pinnavaia ................................. 235/492 |
| 5,153,818 | 10/1992 | Mukougawa et al. . |
| 5,155,663 | 10/1992 | Harase ..................................... 361/395 |
| 5,184,209 | 2/1993 | Kodai et al. ............................. 257/679 |

(List continued on next page.)

FOREIGN PATENT DOCUMENTS

| | | |
|---|---|---|
| 0 214 478 | 3/1987 | European Pat. Off. . |
| 0 228 278 | 7/1987 | European Pat. Off. . |
| 0 228 278 A1 | 7/1987 | European Pat. Off. . |
| 0 321 326 | 6/1989 | European Pat. Off. . |
| 0 385 750 | 9/1990 | European Pat. Off. . |
| 0 392 895 A2 | 10/1990 | European Pat. Off. . |
| 0 406 610 | 1/1991 | European Pat. Off. . |
| 0 476 892 | 3/1992 | European Pat. Off. . |
| 0 533 542 A1 | 3/1993 | European Pat. Off. . |
| 2-301155 | 12/1990 | Japan . |
| 3-14192 | 1/1991 | Japan . |
| 3-2099 | 1/1991 | Japan . |

(List continued on next page.)

OTHER PUBLICATIONS

E. Harai, Nikkei Electronics, Feb. 17, 1992, pp. 155–168.

Kirisawa et al., "A NAND Structured Cell with a New Programming Technology for Highly Reliable 5V–Only Flash EEPROM," IEEE Symposium on VLSI Technology, pp. 129–130.

*Primary Examiner*—Leo P. Picard
*Assistant Examiner*—Hung Van Duong
*Attorney, Agent, or Firm*—Finnegan, Henderson, Farabow, Garrett & Dunner, L.L.P.

[57] ABSTRACT

An external storage device includes an external storage device main includes a thin type external storage device module formed into a package sealed on one side from a storage element containing at least one non-volatile semiconductor memory device, and a flat type external connection terminal connected to an input/output terminal of the storage element and led and exposed to a backside of the module, and an external storage device unit that includes an external storage device main detachable section for engaging, insertedly attaching, and detaching the external storage device main, a resilient contact electrically connecting to the external connection terminal of the external storage device main, and at least a part of a circuit for driving and controlling the storage element.

12 Claims, 4 Drawing Sheets

U.S. PATENT DOCUMENTS

| | | | |
|---|---|---|---|
| 5,208,450 | 5/1993 | Uenishi et al. | 235/492 |
| 5,276,317 | 1/1994 | Ozouf et al. | |
| 5,297,148 | 3/1994 | Harari et al. | 714/710 |
| 5,299,089 | 3/1994 | Lwee. | |
| 5,375,037 | 12/1994 | LeRoux. | |
| 5,402,095 | 3/1995 | Janniere | 235/441 |
| 5,428,569 | 6/1995 | Kato et al. | 365/200 |
| 5,434,395 | 7/1995 | Storck et al. | 235/380 |
| 5,508,971 | 4/1996 | Cernea et al. | 365/185 |
| 5,526,233 | 6/1996 | Hayakawa | 261/737 |
| 5,535,328 | 7/1996 | Harari et al. | 714/7 |
| 5,550,709 | 8/1996 | Iwasaki | 361/684 |
| 5,563,825 | 10/1996 | Cernea et al. | 365/185 |
| 5,568,424 | 10/1996 | Cernea et al. | 365/185 |
| 5,592,420 | 1/1997 | Cernea et al. | 365/185 |
| 5,596,532 | 1/1997 | Cernea et al. | 365/185 |
| 5,602,987 | 2/1997 | Harari et al. | 714/8 |
| 5,621,685 | 4/1997 | Cernea et al. | 365/185 |
| 5,663,901 | 9/1997 | Wallace et al. | 365/52 |
| 5,693,570 | 12/1997 | Cernea et al. | 438/107 |
| 5,932,866 | 8/1999 | Terada et al. | 235/487 |

FOREIGN PATENT DOCUMENTS

| | | |
|---|---|---|
| 3-114788 | 5/1991 | Japan. |
| 4-16396 | 1/1992 | Japan. |
| 4-148999 | 5/1992 | Japan. |
| 5-120501 | 5/1993 | Japan. |
| 5-17269 | 5/1993 | Japan. |
| 5134820 | 6/1993 | Japan. |
| 6-195524 | 7/1994 | Japan. |
| 6-236316 | 8/1994 | Japan. |
| 6-318390 | 11/1994 | Japan. |
| 936796 | 7/1995 | Japan. |
| 62-2706 | 2/1997 | Japan. |

6,141,210

EXTERNAL STORAGE DEVICE

This is a division of application Ser. No. 08/205,451, filed Mar. 4, 1994 now U.S. Pat. No. 5,550,709.

BACKGROUND OF THE INVENTION

1. Field of the Invention

The present invention relates to this external storage devices that are releasably or exchangeably used for storage equipment and external storage medium devices.

2. Description of the Related Art

Two types of storage devices, or memory elements, that are capable of recording and saving various data have been utilized. One is incorporated and fixed within storage equipment or devices, and the other is releasably or exchangeably incorporated in storage equipment or devices. In the latter type, the external storage device, for example, a floppy disk, can freely be attached or detached by a one touch operation. The floppy disks, being storage mediums, can separately be used depending on purpose and object. This therefore produces easier data reduction with optional classification, recording, and saving. However, a problem arises in the floppy disks described. First, the data occasionally disappears when recording or saving the data to produce the disadvantage of less reliability. Second, the floppy disk has a slow access time. Also, when employing smaller sized floppy disks in response to a miniaturization goal, the storage area of the storage medium is correspondingly smaller thereby reducing storage capacity. This results in an adverse effect in realizing both the compact size and high capacity. On the other hand, in semiconductor memory devices used as an external storage device, such as IC memory cards, the problems of floppy disks, such as low reliability on recording and saving data and slow access time, can largely be overcome. In general, IC memory cards comprise a functional circuit in which circuit components containing semiconductor memory devices or elements are mounted on a substrates. A resin case incorporates the functional circuit as an inside attachment. A cover covers and seals an opening surface of the resin case, and external connection terminals, such as two piece connectors, are attached on one edge of the resin case and electrically connect the functional circuit and the storage equipment.

However, IC memory cards are assembled with a large number of components and parts. Thus, a relatively complicated structure is required impacting the thickness of the IC memory card, resulting in difficulty in realizing a compact size. Further, disadvantages arise in practical use because of lower cost performance and production yields in mass producing, in addition to the decreased releasability or fluctuated releasability to the storage equipment and device.

SUMMARY OF THE INVENTION

An object of the present invention is to provide an external storage device having a simplified structure with satisfactory production yields.

Another object of the present invention is to provide an external storage device with a high reliability with respect to recording and saving the data.

Another object of the present invention is to provide an external storage device having a rapid access time.

Still another object of the present invention is to provide an external storage device having high releasability for the storage equipment and device.

The external storage device according to the present invention comprises an external storage device main and an external storage device unit. The external storage device main includes a thin external storage device module formed into a package sealed on one side from a storage element containing at least one non-volatile semiconductor memory device, and a flat type external connection terminal connected to an input/output terminal of the storage element and led and exposed to a backside of the external storage device module. The external storage device unit includes a mechanism for engaging, insertedly attaching, and detaching the external storage device main, a resilient contact electrically connecting to the flat type external connection terminal of the external storage device main.

In the external storage device according to the present invention, the external storage device main may preferably be formed into a package structure sealed on one side. However for easier handling, the external storage device main may also preferably be in the form of a card type structure attached on a supporting plate. The external storage device unit may preferably be assembled and incorporated with a part of or all of the control circuit components or parts, such as semiconductor elements, performing the control function.

The external storage device of a preferred embodiment has a higher integration with a memory capacity to an extent of 16 M-bits per chip. In addition, the storage device is preferably provided as a main memory with a non-volatile semiconductor memory device which does not require a power supply for maintaining storage. The main memory is incorporated into the package sealed on one side to produce a thin type external storage device module or external storage device main. Thus, the external storage device module is easily achieved in a thin structure and at a lower cost by, for example a transfer mold system. To mount a card type external storage device main to the external storage device unit, an insertion system at the side surface of the external storage device unit may be provided. An external connection terminal is led and positioned in a plane with a rear-side of the external storage device main. Hence, a high reliable electrical connection can easily be achieved when attaching and detaching by a one touch system, the external storage device unit. In a card type device, the external storage device itself maintains and exhibits satisfactory releasability for the storage equipment and devices. The card type external storage device main can readily be attached and detached to the external storage device unit, and realizes a function equivalent to a floppy disk device, and simultaneously a reliability of electrical connecting and disconnecting due to the attaching and detaching.

DESCRIPTION OF THE PREFERRED EMBODIMENTS

Embodiments of invention are described referring to FIGS. 1 to 9 as follows.

The present invention has been achieved by means of a cleverly conceived structure and profile where the devices such as semiconductor memory devices or elements are mounted on the conventional substrates and in accordance with the fact that a non-volatile semiconductor memory device or element with a capacity of 16 M-bits per chip corresponds to a 2 M-byte floppy disk.

Figure 1:
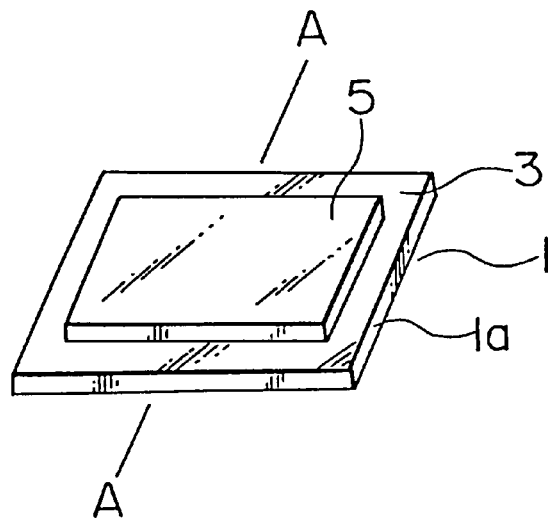
FIG. 1 is a top perspective view of a first example of an external storage device main according to the present invention.
Figure 2:
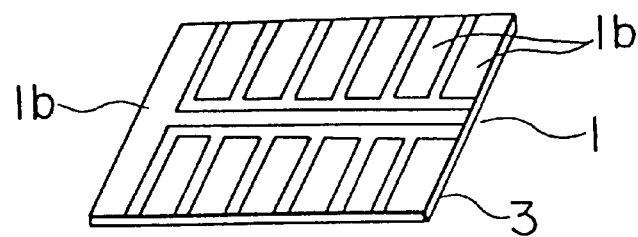
FIG. 2 is a bottom perspective view of the first example of an external storage device main shown in FIG. 1.
Figure 3:
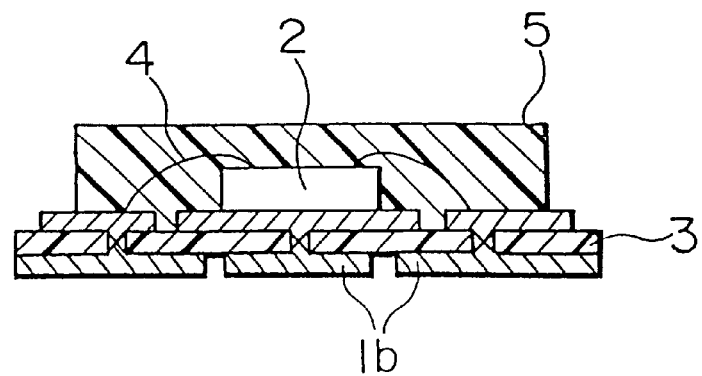
FIG. 3 is an enlarged sectional view taken along line III—III of FIG. 1.

FIGS. 1 to 3 show a first example of an external storage device module constituting features of the thin type external storage device main according to the invention, where FIG. 1 is a perspective view on one-side surface which is sealed on one side by a transfer mold, FIG. 2 a perspective view of a rear-side surface which is one-side sealed by the transfer mold, and FIG. 3 is a sectional view taken along line III—III of FIG. 1.

In this first example, a card type external storage device module 1 is constructed such that a storage element 2, such as a 16 M-bit NAND flash type non-volatile semiconductor memory device, is connected on a surface of the through hole type resin based wiring substrate 3 by wire-bonding 4. The storage element 2 may, if required, include an anti-electrostatic element for preventing electrostatic destruction, the anti-electrostatic element being used for input and output to the memory element 2. Instead of the wire bonding 4, flip chip bonding may also be performed to directly adhere the rear side of the memory element 2 on the resin based wiring substrate 3 which a thin wiring substrate, for example, the substrate 3 is preferable an insulative substrate member made of glass-epoxy resin or the like. The resin based wiring substrate 3, a surface on which is mounted the storage element 2 including a NAND flash type non-volatile semiconductor memory device, is sealed on one side by a transfer mold layer 5. More specifically, the external storage device module 1 (which is designated the external storage device main when considered by itself) is sealed on one side and formed into a flat plate shaped thin type package with an entire thickness of less than about 1 mm. The transfer mold layer 5 may generally be formed of epoxy based resin or the like. However, it also may preferably be formed of a composition containing inorganics.

On the other hand, the one-side sealed through hole type resin based wiring substrate 3, in other words, the backside surface 1a of the external storage device module 1 is arranged with a plane shaped or flat type terminal 1b taken out through the through hole to form the external storage device module 1. The plane shaped terminal 1b is preferably gold (Au)-plated on its surface, and functions as an external connection terminal for electrically connecting to a contact member of an external storage device unit which is described later. In this example, the plane shaped terminal 1b is gold-plated to increase the reliability of the electrical connection. However, such plating is not always required.

Figure 4:
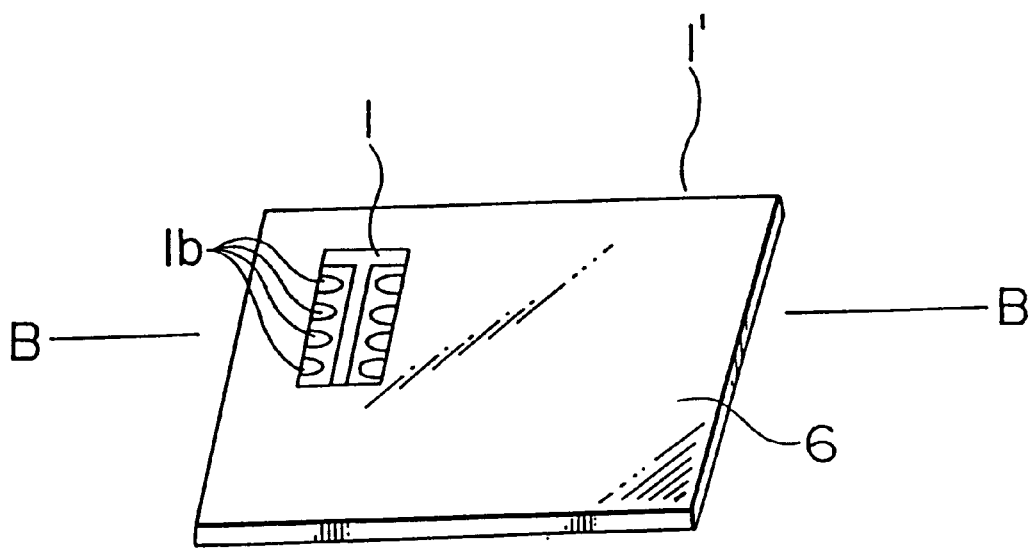
FIG. 4 is a top perspective view of a second example of an external storage device main according to the present invention.
Figure 5:
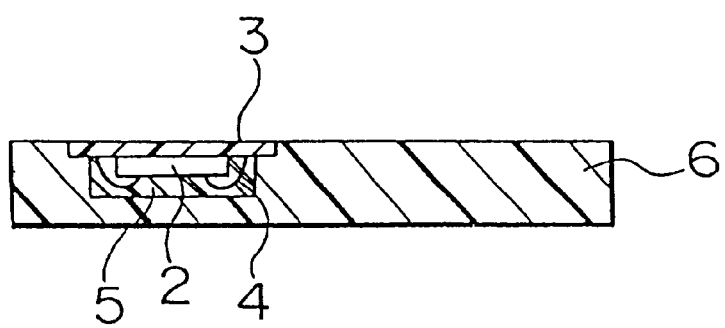
FIG. 5 is an enlarged sectional view taken along line V—V of FIG. 4.

FIGS. 4 and 5 show a second structural example of the structure of a card type external storage device main 1' in which the external storage device module is attached on a card shaped supporter 6, where FIG. 4 is a perspective view, and FIG. 5 is a sectional view taken along line V—V of FIG. 4. The card shaped supporter 6 may preferably be, for example, an insulative resin plate.

In the example above, for a simplified operation the thin external storage device module 1 is incorporated into the card shaped supporter 6 having a length of 42.8 mm, a width of less than 27 mm, and a thickness of 0.76 mm, wherein the size of the support 6 is half the card size regulated in accordance with JEIDA. In more detail, the external storage device module 1 is assembled into the card shaped supporter 6. The supporter 6 has a recessed portion in which the external storage device module 1 can be inserted and attached. As shown in FIGS. 4 and 5, a surface of the external connection terminal 1b of the external storage device module 1 is inserted, attached, and exposed in the same plane as a main surface of the card shaped supporter 6, thereby forming the card type storage device main 1'.

Figure 6:
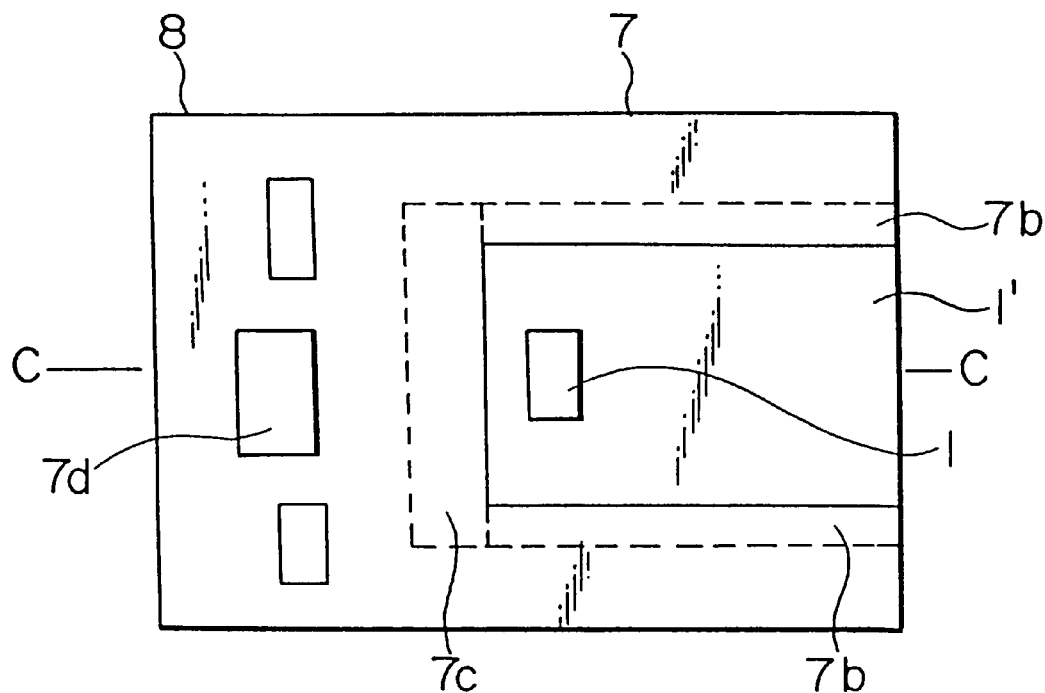
FIG. 6 is a plan view of an example of an external storage device in which the external storage device main shown in FIG. 4 is assembled onto an external storage device unit.
Figure 7:
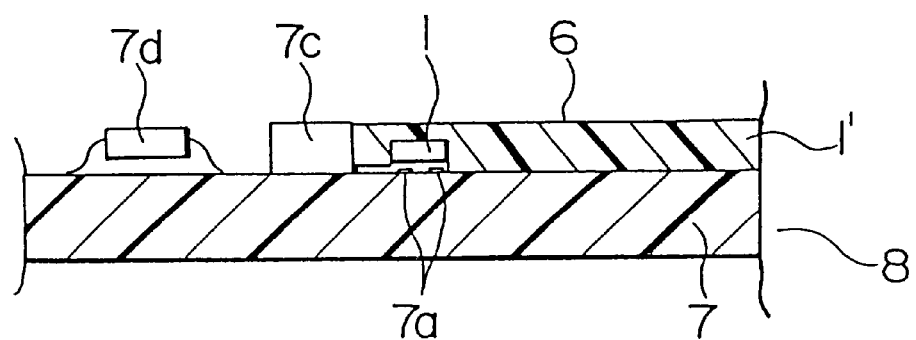
FIG. 7 is a sectional view taken along line VII—VII of FIG. 6.
Figure 8:
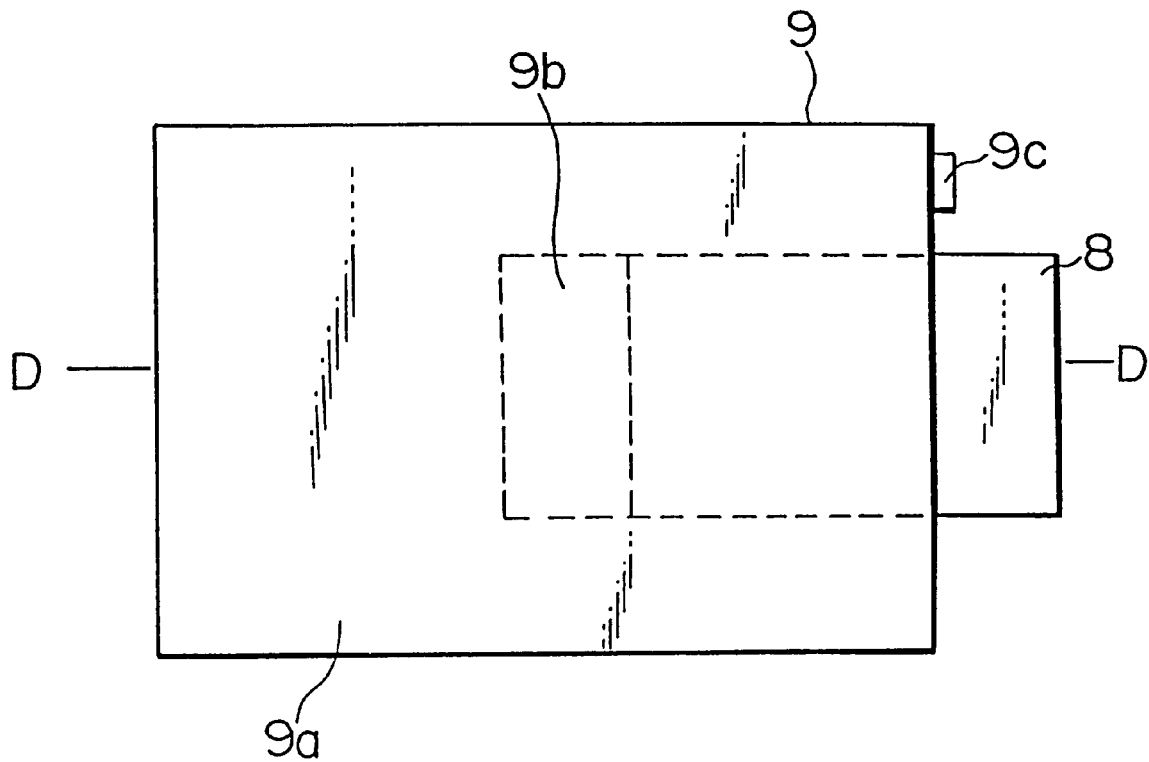
FIG. 8 is a plan view of an example of another external storage device in which the external storage device main shown in FIG. 7 is assembled into an external storage device unit.
Figure 9:
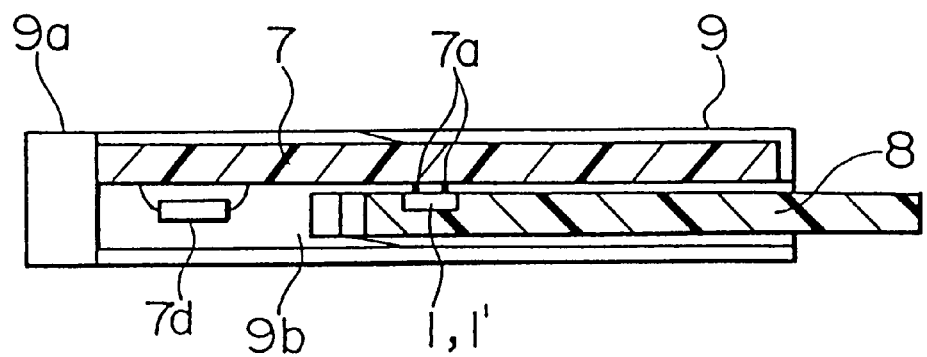
FIG. 9 is a sectional view taken along line IX—IX of FIG. 8.

FIGS. 6 and 7 show a structural example wherein the card type external storage device main 1' is attached to an external storage device unit 7, where FIG. 6 is a plan view, and FIG. 7 is a sectional view taken along line VII—VII of FIG. 6.

In this example, the card type external storage device main 1' has storage elements on one side thereof. The external storage device module 1, in which the storage element 2 including at least a non-volatile semiconductor memory chip, is sealed on one side by the transfer mold layer 5, is inserted and attached into the card shaped supporter 6 to produce the card type external storage device main 1'. The card type external storage device main 1' is releasably attached on and installed into the external storage device unit 7 to form an external storage device 8. The external storage device unit 7 can be electrically connected to the plane shaped external connection terminal 1b provided on the external storage device module 1 on the card, type external storage device main 1'. Simultaneously, the external storage device unit 7 has a structure that the card type external storage device main 1' is releasably attached therefrom.

To releasably attach and detach the card type external storage device main 1', is the external storage device unit 7 has on its surface a recessed portion corresponding to the shape and dimensions of the card type external storage device main 1'. A surface on the recessed portion is arranged with a contact 7a that preferably corresponds to the external connection terminal 1b of the card type external storage device main 1'. To attach and detach the card type external storage device main 1' smoothly, a guide structure 7b and a one touch structure 7c are preferably provided. When the card type external storage device main 1' is inserted, attached or removed from the external storage device unit 7, smooth insertion and extraction is provided by the guide structure 7b, which is placed on a side-surface of the unit 7 in the insertion and extraction direction. Simultaneously, the one touch structure 7c is preferably placed at a tip end of card 1 and provides secure attaching, and electrical connection, and release thereof. If required, a micro-switch system for supplying electricity to the card type external storage device main 1' may preferably be provided with the one touch structure 7c. In FIGS. 6 and 7, element 7d represents an IC element group constituting a part of a drive and control circuit for the storage element 2, including the non-volatile semiconductor memory chip, which the card type external storage device section 1' possesses. The contact 7a for electrically connecting to the external connection terminal 1b is made, for example, using a pin type contact having a spring mechanism.

The external storage device 8, including the card type external storage device main 1', according to the present invention is not limited to the example as described above. For example, the present invention also includes the structure shown in a plan view of FIG. 8 and in a sectional view of FIG. 9 taken along line IX—IX of FIG. 8. The card type external storage device main 1' may preferably be inserted or extracted from a side-surface of a case 9. The case 9 preferably has on one side a pin connection 9a. The case 9 may, for example, be sized to have a length of 85.6 mm, a width of 54.0 mm, and a thickness of 3.3 mm. In more detail, the case 9 is also preferably provided with an insertion and extraction section 9b, such as a space or gap, for attaching, through inserting and extracting, the card type external storage device main 1' from the side-surface of the case 9. A push button 9c may preferably be provided on the case 9 to achieve attaching or detaching to the external storage device unit 7. In particular, when the card type external storage device main 1' is attached by inserting and extracting from the side surface of the external storage device unit 7, compared to a structure having a surface recessed portion for attaching the card type external storage device main 1', it is correspondingly not required to enlarge an outer surface required for attaching the external storage device. Thus, this easily realizes a compact size, fine view, and high reliability due to incorporation (inside mount) of the card type external storage device main 1'.

It is understood that the present invention is not limited to the examples as hereinbefore described. For example, the card type external storage device main 1 according to the present invention may be used, as it is, without attaching it on or to the card shaped supporter 6.

As is apparent from the description above, the external storage device according to the present invention has a higher integration and provides, even in one chip, a larger memory capacity of a non-volatile semiconductor memory device as a main memory. In addition, basic construction is employed in that the external storage device main has a compact structure, and the main memory is sealed on one side by a transfer mold. The use of the one-side sealing system and the non-volatile semiconductor memory device provides a thin structure and compact size of the external storage device. The releasable attaching and ease of carrying provide simple operation and handling, and result in a lower cost. When forming the external storage device by combining with the external storage device unit, reliability in the card type external storage device can be improved, thereby preventing damage or connection failures of the external connection terminal with a graded releasability due to satisfactory slidability. A great number of advantages in practical use are obtained, such as optionally detaching or easily carrying the external storage device main without the possibility of external damage, and a larger capacity of recording or saving data even given the compact size.

What is claimed is:

1. An external storage device for storing data, comprising:
    a storage device module including:
        a substrate having a first face and a second face, the first face having a first region and a second region, a wiring pattern formed on the first face which extends from the first region to the second region, and the substrate having at least one through hole,
        a semiconductor element consisting essentially of at least one flash type non-volatile semiconductor memory device capable of being electrically written with data to be stored, the semiconductor element having an input/output terminal, and being mounted in the first region of the first face of the substrate, and the input/output terminal connected with the wiring pattern in the first region,
        a sealing resin formed only on the first region of the first face of the substrate to seal the semiconductor element,
        a flat type external connection terminal formed on the second face of the substrate, and the flat type external connection terminal connected to the wiring pattern via the at least one through hole; and,
    a card shaped support having a recess for placing the storage device module so that the second face of the substrate is exposed to a surface of the support.

2. The external storage device as claimed in claim 1, wherein the at least one flash type non-volatile semiconductor memory device of the semiconductor element is a NAND flash type non-volatile semiconductor memory device.

3. The external storage device as claimed in claim 1, wherein the storage device module is placed in the recess of the support so that a surface of the flat type external connection terminal is substantially flush with the surface of the support.

4. The external storage device as claimed in claim 1, wherein the semiconductor element is electrically connected to the flat type external connection terminal by flip chip bonding.

5. The external storage device as claimed in claim 1, wherein the semiconductor element is electrically connected to the flat type external connection terminal by wire bonding.

6. The external storage device as claimed in claim 1, wherein the recess of the card shaped support has a step, wherein the step and the second region of the substrate are opposed.

7. The external storage device as claimed in claim 2, wherein the external storage device comprises an anti-electrostatic element.

8. The external storage device as claimed in claim 2, wherein a surface of the flat type external connection terminal of the storage device module is coated with a gold plated layer.

9. The external storage device as claimed in claim 2, wherein the card shaped support has a thickness of less than approximately 1 mm.

10. The external storage device as claimed in claim 2, wherein the card shaped support has an area less than half of a card size area specified in JEIDA standards.

11. The external storage device as claimed in claim 9, wherein the NAND flash type non-volatile semiconductor memory device and the flat type external connection terminal are connected so that the data to be stored can be directly communicated therebetween.

12. The external storage device as claimed in claim 9, wherein the card shaped support has an area less than half of a card size area specified in JEIDA standards.

* * * * *